United States Patent
Olson et al.

(10) Patent No.: US 7,355,188 B2
(45) Date of Patent: Apr. 8, 2008

(54) TECHNIQUE FOR UNIFORMITY TUNING IN AN ION IMPLANTER SYSTEM

(75) Inventors: Joseph C. Olson, Beverly, MA (US); Jonathan Gerald England, Horsham (GB); Morgan D. Evans, Manchester, MA (US); Douglas Thomas Fielder, Peabody, MA (US); Gregg Alexander Norris, Rockport, MA (US); Shengwu Chang, South Hamilton, MA (US); Damian Brennan, Gloucester, MA (US); William Gray Callahan, Rockport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 309 days.

(21) Appl. No.: 11/300,425

(22) Filed: Dec. 15, 2005

(65) Prior Publication Data

US 2006/0284114 A1    Dec. 21, 2006

Related U.S. Application Data

(63) Continuation-in-part of application No. 11/135,307, filed on May 24, 2005, now Pat. No. 7,253,423.

(51) Int. Cl.
*H01J 37/317* (2006.01)
(52) U.S. Cl. .............. 250/492.21; 250/442.11; 250/398; 250/396; 315/506
(58) Field of Classification Search ............. None
See application file for complete search history.

(56) References Cited

U.S. PATENT DOCUMENTS

| | | | |
|---|---|---|---|
| 4,260,897 A | 4/1981 | Bakker et al. | |
| 4,421,988 A | 12/1983 | Robertson et al. | |
| 4,736,107 A | 4/1988 | Myron | |
| 4,922,106 A | 5/1990 | Berrian et al. | |
| 4,980,562 A | 12/1990 | Berrian et al. | |
| 6,580,083 B2 | 6/2003 | Berrian | |
| 6,614,027 B1 | 9/2003 | Iwasawa | |
| 6,645,230 B2 | 11/2003 | Whitehurst | |
| 6,690,022 B2 | 2/2004 | Larsen et al. | |
| 6,870,170 B1 | 3/2005 | Farley et al. | |
| 6,903,350 B1 | 6/2005 | Vanderberg et al. | |
| 6,992,309 B1 * | 1/2006 | Petry et al. | 250/492.21 |
| 2002/0003215 A1 | 1/2002 | Berrian | |

\* cited by examiner

*Primary Examiner*—Jack I. Berman
*Assistant Examiner*—Zia R. Hashmi
(74) *Attorney, Agent, or Firm*—Hunton & Williams LLP/Rambus I

(57) ABSTRACT

A technique for uniformity tuning in an ion implanter system is disclosed. In one particular exemplary embodiment, the technique may be realized as a method for ion beam uniformity tuning. The method may comprise generating an ion beam in an ion implanter system. The method may also comprise tuning one or more beam-line elements in the ion implanter system to reduce changes in a beam spot of the ion beam when the ion beam is scanned along a beam path. The method may further comprise adjusting a velocity profile for scanning the ion beam along the beam path such that the ion beam produces a substantially uniform ion beam profile along the beam path.

13 Claims, 8 Drawing Sheets

TECHNIQUE FOR UNIFORMITY TUNING IN AN ION IMPLANTER SYSTEM

CROSS-REFERENCE TO RELATED APPLICATIONS

This patent application is a continuation-in-part of U.S. patent application Ser. No. 11/135,307, filed May 24, 2005, which is hereby incorporated by reference herein in its entirety.

FIELD OF THE DISCLOSURE

The present disclosure relates generally to semiconductor equipment and, more particularly, to a technique for uniformity tuning in an ion implanter system.

BACKGROUND OF THE DISCLOSURE

Ion implantation is a process of depositing chemical species into a substrate by direct bombardment of the substrate with high-energy ions. In semiconductor fabrication, ion implanters are used primarily for doping processes that alter the type and level of conductivity of target materials. A precise doping profile in an integrated circuit (IC) substrate and its thin-film structure is often crucial for the IC performance. To achieve a desired doping profile, one or more ion species may be implanted in different doses and at different energy levels. A specification of the ion species, doses and energies is referred to as an ion implantation recipe.

FIG. 1 depicts a known ion implanter system 100. As is typical for most ion implanter systems, the system 100 is housed in a high-vacuum environment. The ion implanter system 100 may comprise an ion source 101 and a complex series of components through which an ion beam 10 passes. The series of components may include, for example, an extraction electrode 102, a suppression electrode 103, a ground electrode 104, a filter magnet 106, an acceleration or deceleration column 108 (with focus electrodes and tube lenses therein), an analyzer magnet 110, a rotating mass slit 112, a low-energy lens 113, a scanner 114, and a corrector magnet 116. Much like a series of optical lenses that manipulate a light beam, the ion implanter components can filter and focus the ion beam 10 before steering it towards a target wafer 120 (located in a wafer plane 12). A number of measurement devices, such as a dose control Faraday cup 118, a traveling Faraday cup 124, and a setup Faraday cup 122, may be used to monitor and control the ion beam conditions.

For a uniform distribution of dopant ions, an ion beam is typically scanned across the surface of the target wafer. FIG. 2 shows a typical setup for continuous wafer implantation with an ion beam. In an ion implanter system, a wafer 204 may flow slowly along an axis 212 through a wafer chamber. At the same time, an ion beam spot 202 may be scanned horizontally across the surface of the wafer 204. The scanned ion beam spot 202 may form a beam path 20 that has end points 208 and 210. A dose control Faraday cup 206 may be used to measure the ion beam current.

In production, it is desirable to achieve a uniform ion beam profile along the beam path. The process of tuning the ion implanter system to achieve the uniform ion beam profile is called "uniformity tuning."

FIG. 3 illustrates a prior art method for uniformity tuning. In a setup similar to the one shown in FIG. 2, an ion beam spot 302 is scanned at a constant scan velocity along a path 30 between end points 308 and 310. The ion beam spot 302 is relatively small compared to the size of a wafer 304, which is typical for medium- and high-energy ion beams. In existing uniformity tuning methods for these types of ion beams, it is usually assumed that: (1) the ion beam spot will maintain substantially the same size and deliver substantially the same current during scanning; and (2) the ion beam spot is scanned fully off the wafer edge. It follows from these assumptions that, during scanning, the ion beam spot will only exhibit small changes and any resulting non-uniformity in the ion beam current density distribution of the scanned beam along the beam path is also small. Thus, in existing uniformity tuning methods, the ion beam spot profile is only measured once (unscanned) at the center of the wafer. In FIG. 3, a waveform 32 illustrates an individual beam dose density profile for the ion beam spot 302. As the ion beam spot 302 is swept along the path 30, the ion beam current density of the scanned ion beam at each point is an accumulated effect of one or more individual beam dose density profiles of the ion beam spot 302. A waveform 34 illustrates an ion beam current density distribution of the scanned ion beam between the end points 308 and 310. Since the individual beam dose density profile of the ion beam spot 302 is practically the same everywhere along the path 30, there is a linear relationship between the current density of the scanned beam and the scan velocity. That is, for each location in the path 30, a small increase in the scan velocity will cause a proportional decrease in the ion beam current density at that location, and a small decrease in the scan velocity will cause a proportional increase in the ion beam current density. Existing uniformity tuning methods are based on this assumption of linearity—if the ion beam current density profile 34 is not uniform enough, a typical approach is to adjust, for each unit distance along the path 30, the ion beam spot scan velocity proportionally to the accumulated ion beam current within that unit distance.

It should be noted that the scanned ion beam current density rolls off quickly near both end points 308 and 310. However, since the ion beam spot 302 is scanned fully off the wafer edges, the roll-offs do not affect ion beam coverage of the wafer 304. It should also be noted that, once the ion beam spot 302 has been swept fully off the wafer 304, the ion beam current no longer contributes to the wafer implantation. The ratio between the accumulated ion beam current on the wafer and the total ion beam current accumulated during a full scan is referred to as "beam utilization." Beam utilization indicates what portion of the total ion beam current is actually utilized for wafer implantation.

In addition, in existing ion implanter systems, uniformity tuning typically follows beam-line tuning. For example, in the ion implanter system 100 as shown in FIG. 1, the ion source 101 and one or more of the beam-line elements (e.g., extraction electrode 102, suppression electrode 103, filter magnet 106, acceleration or deceleration column 108, analyzer magnet 110, low-energy lens 113, scanner 114, or corrector magnet 116) are usually adjusted first to achieve a highest possible ion beam current level in order to achieve a high efficiency for ion implantation production. Only after the ion beam current has been maximized, will the uniformity tuning start.

The above-described methods for uniformity tuning have been applied to medium- and high-energy ion beams with acceptable results. However, as the semiconductor industry is producing devices with smaller and smaller feature sizes, ion beams with lower energies are required for wafer implantation. Low-energy ion beams present some unique challenges that cannot be tackled with existing methods. For example, a low-energy ion beam tends to produce a current that is much lower than desired because it is difficult to transport low-energy ions due to a space-charge effect. Because of the low current, beam utilization becomes an important factor that affects implantation productivity of low-energy ion beams. And a low-energy ion beam usually has a large beam spot, which can cause problems for both beam utilization and uniformity tuning.

FIG. 4 illustrates a typical low-energy ion beam spot 402 being scanned along a path 40 across a wafer 404. As shown, the size of the ion beam spot 402 is comparable to the size of the wafer 404. Thus, the wafer 404 sees a full ion beam spot in only a small portion of the beam path 40. If the ion beam spot 402 is scanned fully off the wafer 404 as in existing methods, the beam utilization will be much lower. Further, the individual beam dose density profiles 42 of the ion beam spot 402 vary significantly along the path 40, and the resulting scanned ion beam current density profile (waveform 44) is highly non-uniform. As noted above, the existing uniformity tuning methods require that changes in the ion beam spot be small and the non-uniformity in the scanned ion beam profile be small. In the case of low-energy ion beams, the above-described assumption of linearity no longer stands.

The ion beam setup sequence in existing ion implanter systems is also unsuitable for low-energy ion beams. If the beam-line tuning precedes the uniformity tuning and aims for the highest ion beam current possible, a resulting low-energy ion beam may have an unacceptably large beam spot. During scanning, the ion beam with such a large beam spot may become clipped by the beam-line elements (e.g., apertures or magnets), thereby causing even more significant changes in the shape and size of the beam spot. As a result, the existing maximum-current approach of beam-line setup can make the uniformity tuning even more difficult, if not impossible. Furthermore, uniformity tuning can also affect the ion beam current level to some extent. For a low-energy ion beam, the uniformity tuning may lead to a significant reduction in the ion beam current. However, existing uniformity tuning methods do not adequately recognize such effect on ion beam current.

For at least the foregoing reasons, the existing uniformity tuning methods cannot be applied to an ion implanter system that produces low-energy ion beams.

In view of the foregoing, it would be desirable to provide a solution for uniformity tuning in an ion implanter system which overcomes the above-described inadequacies and shortcomings.

SUMMARY OF THE DISCLOSURE

A technique for uniformity tuning in an ion implanter system is disclosed. In one particular exemplary embodiment, the technique may be realized as a method for ion beam uniformity tuning. The method may comprise generating an ion beam in an ion implanter system. The method may also comprise tuning one or more beam-line elements in the ion implanter system to reduce changes in a beam spot of the ion beam when the ion beam is scanned along a beam path. The method may further comprise adjusting a velocity profile for scanning the ion beam along the beam path such that the ion beam produces a substantially uniform ion beam profile along the beam path.

In accordance with other aspects of this particular exemplary embodiment, the step of tuning the one or more beam-line elements may further comprise maintaining a current produced by the ion beam within a predetermined range that is less than a maximum ion beam current level. The method may further comprise stopping the adjustment of the velocity profile if the current produced by the ion beam falls below the predetermined range and re-tuning the one or more beam-line elements to recover the current.

In accordance with further aspects of this particular exemplary embodiment, the one or more beam-line elements may be selected from a group consisting of: an ion source; an extraction electrode; a suppression electrode; a filter magnet; a focus lens; a tube lens; an analyzer magnet; a low-energy lens; a scanner; and a corrector magnet.

In accordance with additional aspects of this particular exemplary embodiment, the method may further comprise the steps of: measuring the ion beam at a plurality of predetermined locations along the beam path, calculating an ion beam profile along the beam path based at least in part on the ion beam measurements at the plurality of predetermined locations, and adjusting the velocity profile based at least in part on the calculated ion beam profile.

In another particular exemplary embodiment, the technique may be realized by at least one signal embodied in at least one carrier wave for transmitting a computer program of instructions configured to be readable by at least one processor for instructing the at least one processor to execute a computer process for performing the method as recited above.

In yet another particular exemplary embodiment, the technique may be realized by at least one processor readable carrier for storing a computer program of instructions configured to be readable by at least one processor for instructing the at least one processor to execute a computer process for performing the method as recited above.

In still another particular exemplary embodiment, the technique may be realized as a system for ion beam uniformity tuning. The system may comprise means for generating an ion beam in an ion implanter system. The system may also comprise means for tuning one or more beam-line elements in the ion implanter system to reduce changes in a beam spot of the ion beam when the ion beam is scanned along a beam path. The system may further comprise means for adjusting a velocity profile for scanning the ion beam along the beam path such that the ion beam produces a substantially uniform ion beam profile along the beam path.

In accordance with other aspects of this particular exemplary embodiment, the means for tuning the one or more beam-line elements may further comprise means for maintaining a current produced by the ion beam within a predetermined range that is less than a maximum ion beam current level. The system may further comprise means for stopping the adjustment of the velocity profile if the current produced by the ion beam falls below the predetermined range and means for re-tuning the one or more beam-line elements to recover the current.

In accordance with further aspects of this particular exemplary embodiment, the one or more beam-line elements may be selected from a group consisting of: an ion source; an extraction electrode; a suppression electrode; a filter magnet; a focus lens; a tube lens; an analyzer magnet; a low-energy lens; a scanner; and a corrector magnet.

In accordance with additional aspects of this particular exemplary embodiment, the system may further comprise: means for measuring the ion beam at a plurality of predetermined locations along the beam path, means for calculating an ion beam profile along the beam path based at least in part on the ion beam measurements at the plurality of predetermined locations, and means for adjusting the velocity profile based at least in part on the calculated ion beam profile.

In a further particular exemplary embodiment, the technique may be realized as method for uniformity tuning in an ion implanter system. The method may comprise measuring an ion beam at a plurality of predetermined locations along a beam path. The method may also comprise establishing a mathematical model that estimates, based on the ion beam measurements at the plurality of predetermined locations, an ion beam profile caused by scanning the ion beam along the beam path according to a velocity profile. The method may further comprise adjusting the velocity profile in a plurality of iteration steps to cause the ion beam profile to be substantially uniform along the beam path, wherein, in each iteration step, a correction to the velocity profile is calculated, with the mathematical model, based on corrections to the velocity profile and resulting changes in the ion beam profile during the previous two or more iteration steps.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Embodiments of the present disclosure are directed to an improved method for uniformity tuning in an ion implanter system. According to the improved method, an ion beam profile along a beam path can be precisely determined by measuring the scanned ion beam spot at a plurality of predetermined locations. The measurements may be taken with either a single measurement device or an array of multiple measurement devices. The ion beam profile may accurately capture all the changes, large or small, in the ion beam spot during scanning. Based on this ion beam profile, a desired scan velocity profile may be generated to closely control the scanned ion beam in order to achieve a more uniform ion beam profile. This improved method may be especially useful for low-energy ion beams and may also help improve beam utilization by allowing partial ion beam scans.

Figure 4:
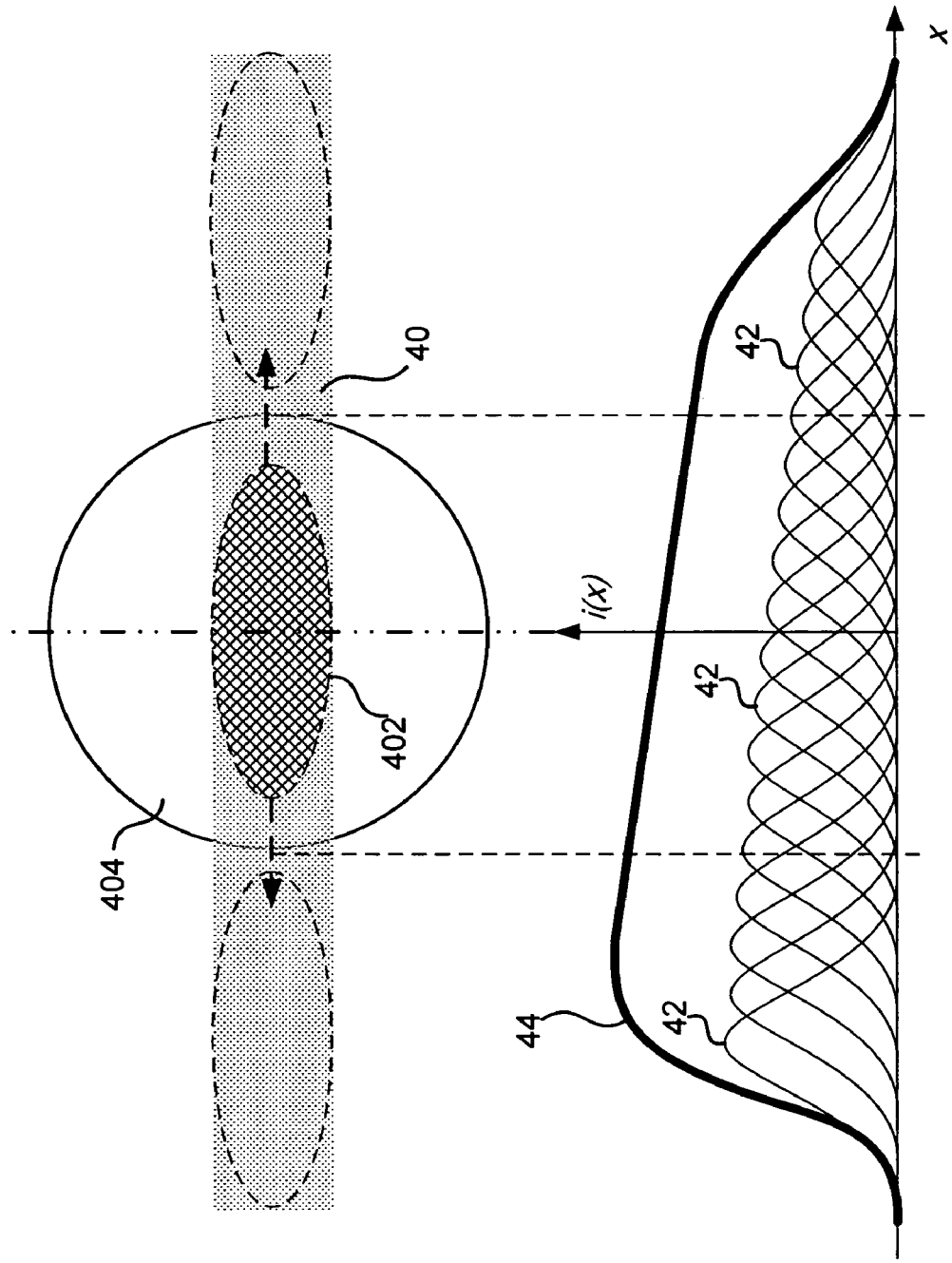
FIG. 4 illustrates a typical low-energy ion beam spot being scanned across a wafer.

Referring again to FIG. 4, as the ion beam spot 402 is swept along the path 40, the ion beam current density of the scanned ion beam at each point is an accumulated effect of one or more individual beam dose density profiles of the ion beam spot 402. The waveform 42 illustrates an "individual beam dose density distribution" for the scanned ion beam spot 402. The waveform 44 illustrates a "current density distribution" of the scanned ion beam along the path 40, which may also be referred to as a "scanned beam profile." The scanned beam profile 44 is the beam current density delivered by the scanned ion beam spot 402 along the beam path 40. The effect of the scanned ion beam spot 402 can be considered equivalent to an infinite number of unscanned ion beam spots located in a series of continuous positions along path 40, wherein each of the unscanned ion beam spots delivers a beam current for an infinitesimal duration. In a numerical simulation, however, the current density distribution (or scanned beam profile) of the scanned ion beam spot 402 may be approximated with a finite number of unscanned ion beam spots, each delivering a beam current for a finite duration, as will be described in detail below. In contrast with the scanned ion beam spot, an unscanned ion beam is called a "spot beam." The spatial distribution of a spot beam current density is called a "spot beam profile." The individual beam dose density distribution 42 is therefore the product of a corresponding spot beam profile and a finite duration.

Figure 5:
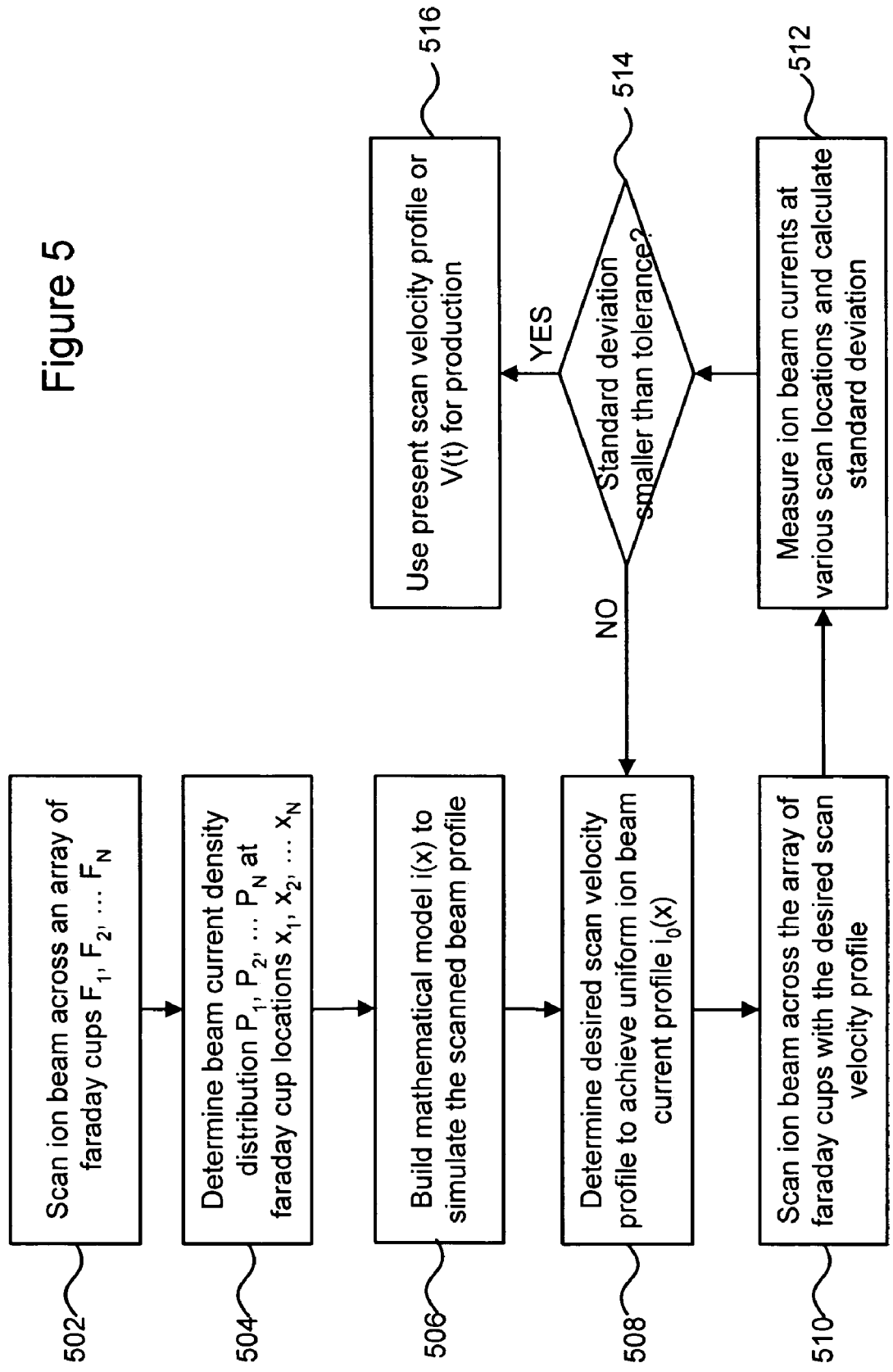
FIG. 5 is a flow chart illustrating an exemplary method for uniformity tuning in an ion implanter system in accordance with an embodiment of the present disclosure.

Referring to FIG. 5, there is shown a flow chart illustrating an exemplary method for uniformity tuning in an ion implanter system in accordance with an embodiment of the present disclosure. In step 502, an ion beam may be scanned across an array of measurement devices in an ion implanter system. Scanning of the ion beam may follow a predetermined scan velocity profile. The scan velocity profile $v(x)$, x being a scan distance from a scanning origin (e.g., center of the wafer), may be achieved by controlling the scanning mechanism with a voltage waveform $V(t)$, for example. According to one embodiment of the disclosure, the ion beam may be scanned in step 502 at a slow and constant velocity. Each measurement device may detect ions and/or measure a spot beam current density distribution in relation with scan voltage $V(t)$. The measured spot beam current density distribution in relation with the scan voltage $V(t)$ may be translated into a spot beam profile at the device location. In this example, since the ion implanter system is tuned to achieve a uniform ion beam current, current-measuring Faraday cups may be used as the measurement devices. However, it should be appreciated that other measurement devices may also be used in accordance with alternative embodiments of the present disclosure. For illustration purposes, the Faraday cups used herein are referred to as Faraday cups $F_1, F_2, \ldots$ and $F_N$. The location of each Faraday cup may be marked by its distance from the scanning origin. Thus, the Faraday cups $F_1, F_2, \ldots$ and $F_n$ may have locations at $X_1$, $X_2$, ... $X_N$, respectively. Typically, the array of Faraday cups may be set up along the scanning path of the ion beam, and may be positioned in a wafer plane or in a plane that is substantially in parallel with the wafer plane.

Figure 6:
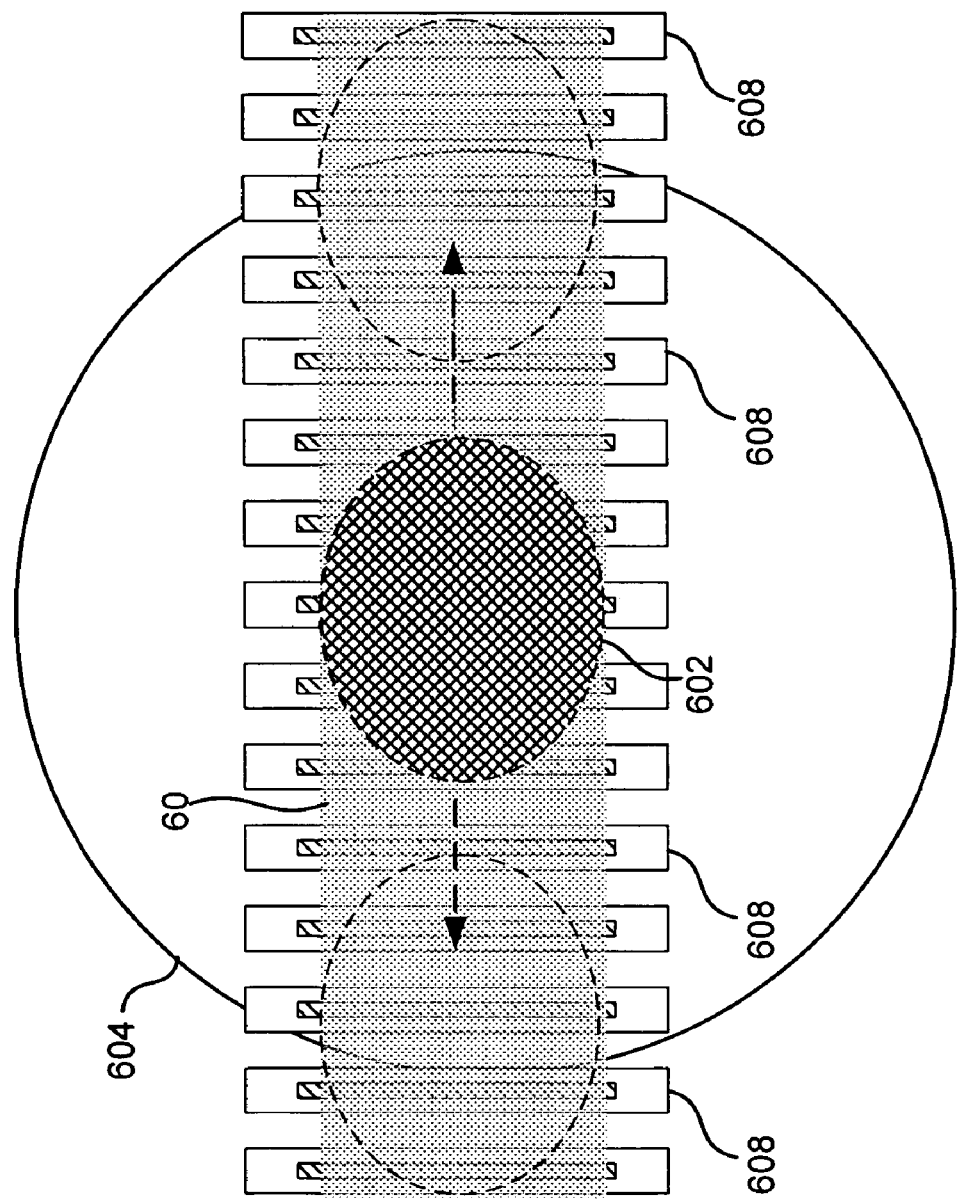
FIG. 6 illustrates an exemplary setup for uniformity tuning in an ion implanter system in accordance with an embodiment of the present disclosure.

FIG. 6 illustrates an exemplary setup in accordance with an embodiment of the present disclosure. In FIG. 6, an ion beam spot 602 is scanned along a path 60 across a wafer 604. Faraday cups 608 may be positioned along the path 60 in a wafer plane or in a plane that is substantially in parallel with the wafer plane. As shown, the Faraday cups 608 may be arranged in parallel with one another with even spacing. However, other arrangements may also be effective for measurement purposes. For example, more Faraday cups may be set up in areas where the ion beam spot 602 exhibits larger or more frequent changes. It may also be desirable to set up more Faraday cups near the end points of the beam path 60 where the total ion beam current tends to be more non-uniform.

Referring back to FIG. 5, in step 504, a plurality of spot beam current density distributions (or spot beam profiles) $P_1$, $P_2$, ... and $P_N$ may be determined at the Faraday cup locations $X_1$, $X_2$, ... $X_N$. Each Faraday cup may measure a spot beam current density in relation with the scan voltage as the ion beam is sweeping through the Faraday cup location, and the measured spot beam current density in relation with the scan voltage may be then be translated into a spot beam profile.

Alternatively, measurements of the ion beam spot at the multiple locations along the beam path may be achieved with a single measurement device. For example, the ion beam may be deflected with a DC voltage to a first predetermined location, and a traveling Faraday cup may be moved across the ion beam spot at the first location to measure the spot beam current density in relation with the position of traveling Faraday cup. The measured spot beam current density in relation with the position of traveling Faraday cup may be translated into the spot beam profile at the first location. Then, the ion beam may be deflected to a second predetermined location, and the traveling Faraday cup may be moved across the ion beam spot at the second location to take spot beam profile measurements. These steps may be repeated for all the predetermined locations. Further, at each measurement location, instead of moving the traveling Faraday cup across an ion beam spot, the traveling Faraday cup may be kept stationary and the ion beam spot may be slowly scanned across the traveling Faraday cup to take measurements.

In step 506, a mathematical model $i(x)$ may be built for the scanned beam profile. According to one embodiment, a series of spot beam profiles $p_1, p_2, \ldots$ and $p_M$ corresponding to a series of discrete locations $x_1, x_2, \ldots x_M$ may be determined based on the measured spot beam profiles $P_1, P_2, \ldots$ and $P_N$ by using a method of interpolation or extrapolation. An individual beam dose density distribution for a predetermined location $x_k$ may be approximated by multiplying the spot beam profile $p_k$ with a duration $t_k$ during which the spot beam delivers current to the location $x_k$. All the individual spot beam dose density distributions $p_1 t_1$, $p_2 t_2, \ldots$ and $p_M t_M$ may be summated to generate the scanned beam profile model $i(x)=p_1 t_1+p_2 t_2+ \ldots +p_M t_M$, wherein $t_1+t_2+\ldots+t_M \equiv T$, T being the total scan time for the ion beam to scan from one endpoint to the other.

In step 508, a desired scan velocity profile may be determined based on the scanned beam profile model $i(x)$. For example, to achieve a uniform scanned beam profile, the model $i(x)=p_1 t_1+p_2 t_2+ \ldots +p_M t_M$ may be adjusted to minimize its standard deviation over the beam path. That is, one or more of the durations $t_1$, $t_2$, ... and $t_M$ may be optimized or adjusted to generate a uniform scanned beam profile $i_0(x)$. For example, for locations where the ion beam current is lower than desired, the local scan velocity may be reduced (i.e., longer scan duration). Conversely, for locations where the ion beam current is higher than desired, the local scan velocity may be increased (i.e., shorter scan duration). The model-predicted profile $i_0(x)$ may be used to predict an initial scan voltage waveform $V_0(t)$. Alternatively, an initial scan velocity profile $v_0(x)$ may be determined based on the durations $t_1$, $t_2$, ... and $t_M$. The scanned ion beam profile $s(x)$ may be the actual beam current density value of a scanned ion beam as a function of scanning distance x. The model $i(x)$ may be used to simulate or predict the scanned ion beam profile $s(x)$.

In step 510, the ion beam may be scanned across the array of Faraday cups based on the desired scan velocity profile such as the initial scan voltage waveform $V_0(t)$ or the initial scan velocity profile $v_0(x)$ as determined in step 508.

In step 512, ion beam currents may be measured at various locations in the wafer plane or in a measurement plane in parallel with the wafer plane. For example, the actual scanned beam current density distribution $s_0(x)$, which corresponds to the model-predicted profile $i_0(x)$, may be measured by moving the traveling Faraday cup across the scanned ion beam. Based on the plurality of measured ion beam current values, a standard deviation of ion beam current may be calculated.

In step 514, it may be determined whether the standard deviation of ion beam current is smaller than a tolerance value. If the standard deviation is smaller than the tolerance value (i.e., within specification), then the present scan velocity profile $v(x)$ or scan voltage waveform $V(t)$ may be used for wafer production in step 516. However, if the standard deviation is greater than the tolerance value, then the ion beam current profile is not uniform enough. In that case, the process may loop back to step 508 and the scan velocity profile may be adjusted or recalculated.

When the measured scanned beam profile $s_0(x)$ is not within specification, the scanned beam profile model $i(x)$ may be adjusted depending on how much $s_0(x)$ deviates from $i_0(x)$. The difference between the previous model-predicted scanned beam profile $i_0(x)$ and the resulting actual scanned beam profile $s_0(x)$ is referred to as "modeling error." The modeling error $s_0(x)-i_0(x)$ may be reduced by increasing the number M of spot beam profiles. For example, the number N of predetermined locations $X_1$, $X_2$, ... $X_N$ for measuring the spot ion beam profiles $P_1$, $P_2$, ... and $P_N$ may be increased to measure the beam spot more accurately. The modeling error $s_0(x)-i_0(x)$ may be reduced to be substantially small such that a small correction in the model-calculated scan velocity profile $v(x)$ can lead to a linear local change in the scanned beam profile $s(x)$. With the modeling error small enough to support linear adjustments, the durations $t_1, t_2, \ldots t_M$ in the scanned beam profile model $i(x)$ may be re-optimized or re-adjusted. And a desired scan velocity profile $v_d(x)$ may be determined based on the adjusted durations $t_1$, $t_2$, ... and $t_M$. The modeling error $s_0(x)-i_0(x)$ may be used to calculate a desired scan velocity profile $v_d(x)$ or facilitate a feedback mechanism to adjust the initial scan velocity profile $v_0(x)$.

According to one embodiment, the desired scan velocity profile $v_d(x)$ may be determined in the following steps. First, a mirror image of the profile $s_0(x)$ may be mathematically created with the profile $i_0(x)$ as the mirroring reference. The so-created mirror profile $ms_0(x)$ may satisfy the following relation:

$$ms_0(x) - i_0(x) = i_0(x) - s_0(x), \text{ or}$$

$$ms_0(x) = 2 \cdot i_0(x) - s_0(x).$$

Figure 8:
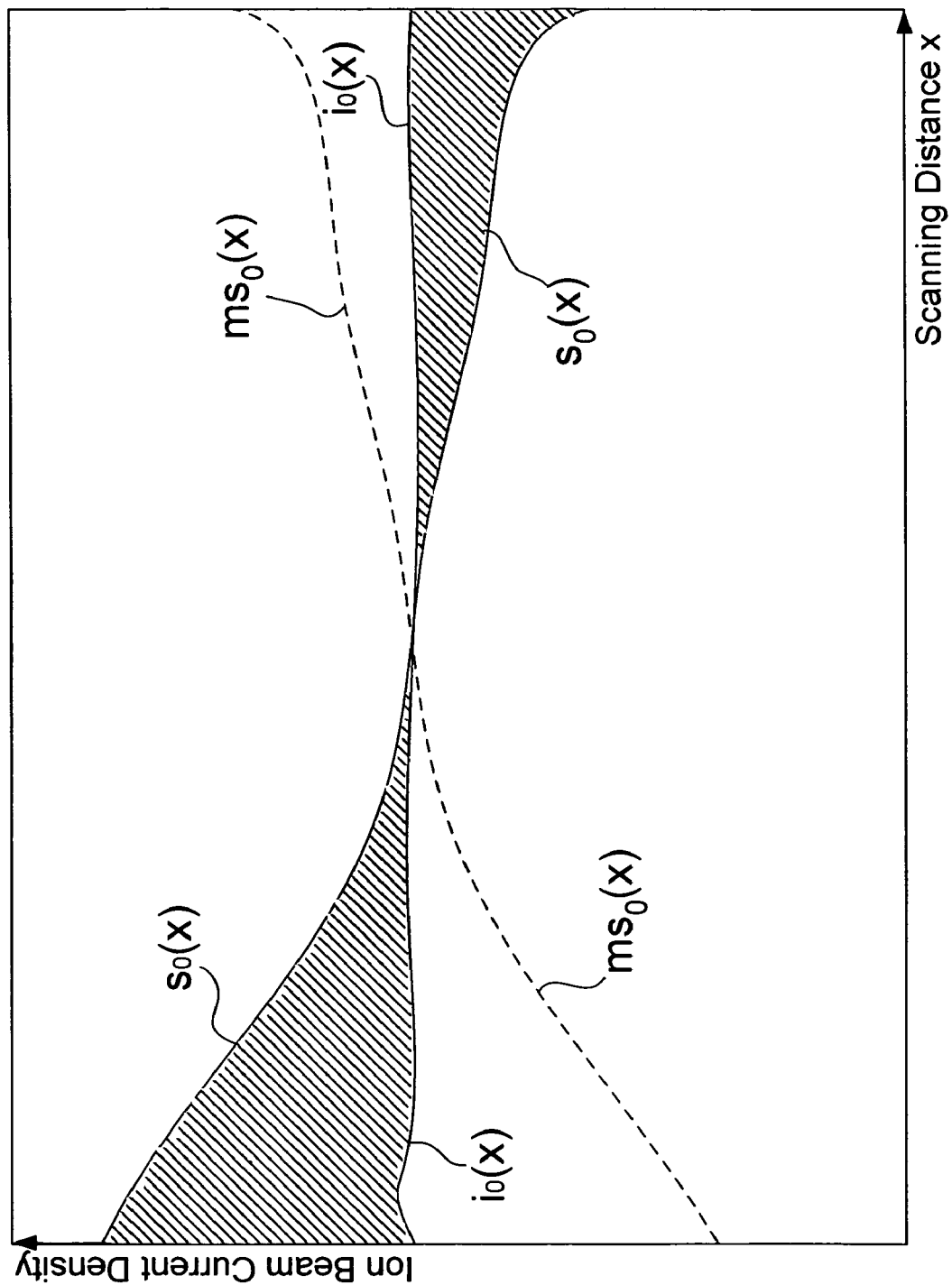
FIG. 8 illustrates an exemplary set of a model-predicted scanned beam profile $i_0(x)$, a scanned beam profile $s_0(x)$, and a mirrored profile $ms_0(x)$ in accordance with an embodiment of the present disclosure.

FIG. 8 illustrates an exemplary set of a model-predicted scanned beam profile $i_0(x)$, a scanned beam profile $s_0(x)$, and a mirrored profile $ms_0(x)$. As shown, the model-predicted scanned beam profile $i_0(x)$ represents a relatively smooth and uniform beam current density distribution. The actual scanned beam profile $s_0(x)$ acquired based on the model-predicted scanned beam profile $i_0(x)$ may deviate from $i_0(x)$ in various locations along the beam path. The shaded area between the $s_0(x)$ and $i_0(x)$ curves represents the modeling error $s_0(x) - i_0(x)$ between the two profiles. If each point on the $s_0(x)$ curve has a mirror point with respect to the corresponding point on the $i_0(x)$ curve, the resulting mirrored points form the mirrored profile $ms_0(x)$. Next, the durations $t_1, t_2, \ldots$ and $t_M$ in the model $i(x) = p_1 t_1 + p_2 t_2 + \ldots + p_M t_M$ may be adjusted to generate a model-predicted scanned beam profile $i_d(x)$ that closely fits the mirrored profile $ms_0(x)$. Since the mirrored profile $ms_0(x)$ accounts for the earlier modeling error, the adjusted model $i_d(x)$ with $ms_0(x)$ as target should lead to an actual scanned beam profile $s_d(x)$ that approximates the smooth and uniform profile $i_0(x)$. Based on the adjusted durations of $t_1, t_2, \ldots$ and $t_M$, a desired scan voltage waveform $V_d(t)$ or scan velocity profile $v_d(x)$ may be determined.

Alternatively, desired adjustments or corrections may be calculated and applied to the initial scan velocity profile. The adjustments or corrections may be applied in an iterative process. In practice, adjustments may be calculated and applied to a voltage waveform V(t) that controls the scanning of the ion beam. One method for calculating scan speed correction is disclosed in U.S. Pat. No. 6,710,359, filed Mar. 23, 2001, entitled "Methods and Apparatus for Scanned Beam Uniformity Adjustment in Ion Implanters," which is incorporated herein in its entirety.

In an iterative process of correcting the scan velocity profile v(x), corrections to the scan velocity profile v(x) may take into account historical modeling errors. For example, assume that, after the n-th iteration (n is an integer, $n \geq 1$), the model-predicted scanned beam profile is $i_n(x)$ and the resulting actual scanned beam profile is $s_n(x)$. Then, the n-th modeling error is $(s_n(x) - i_n(x))$. Due to non-linearity, an (n+1)-th correction $\Delta_{(n+1)} v(x)$ simply calculated to exactly offset the n-th modeling error $(s_n(x) - i_n(x))$ may not eliminate or even reduce it. Thus, for the (n+1)-th iteration, it may be desirable to factor into the (n+1)-th correction $\Delta_{(n+1)} v(x)$ the corrections and corresponding modeling errors in the previous iterations. For example, the (n+1)-th correction $\Delta_{(n+1)} v(x)$ may be calculated based on the (n-1)-th as well as the n-th iteration data.

The improved method for uniformity tuning, as described above, does not require a pre-existing linear relationship between the scan velocity and the current density of the scanned beam. That is, the improved method no longer relies on the assumption that the ion beam spot will only exhibit small changes or that the non-uniformity in the scanned ion beam profile is small. Therefore, embodiments of the present disclosure may be successfully applied to an ion implanter system with low-energy ion beams.

Further, to improve beam utilization, the ion beam spot does not have to be scanned fully off the wafer surface. Instead, the ion beam spot can be scanned partially off the wafer surface. As shown in FIG. 6, at either end of the beam path 60, the ion beam spot 602 still partially overlaps the wafer 604. Unlike existing uniformity tuning methods, embodiments of the present disclosure is capable of accommodating partial ion beam scans. A partial scan of the ion beam spot typically causes significant non-uniformities in the scanned beam profile, especially near the end points of the beam path where the scanned ion beam current density rolls off. However, such non-uniformities may be cured with the improved uniformity tuning method described above. For example, the non-uniformities near the end points of the beam path may be precisely captured by multiple spot beam profile measurements. A scan velocity profile may be generated accordingly, wherein the current density roll-offs may be compensated precisely by the calculations based on the model-prediction and with significantly slower scan velocities near the end points.

Figure 7:
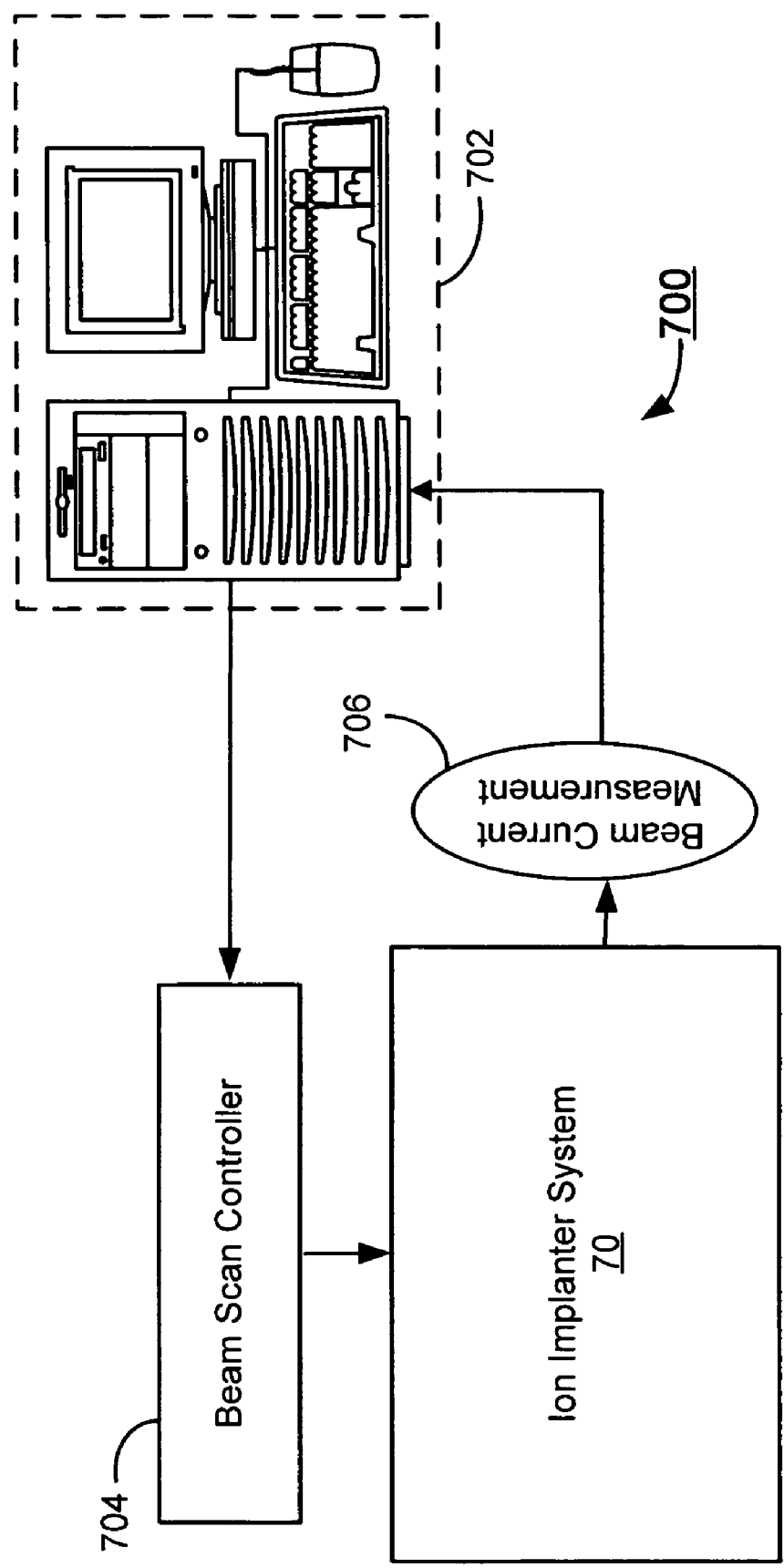
FIG. 7 illustrates an exemplary system for uniformity tuning in an ion implanter system in accordance with an embodiment of the present disclosure.

FIG. 7 illustrates an exemplary system for uniformity tuning in an ion implanter system 700 in accordance with an embodiment of the present disclosure. The system 700 may comprise a processor unit 702 which may be a microprocessor, micro-controller, personal computer (PC), or any other processing device. The system 700 may also comprise a beam scan controller 704 that controls a scanned ion beam in an ion implanter system 70 according to instructions received from the processor unit 702. The system 700 may further comprise a beam current measurement interface 706 through which the processor unit 702 may receive ion beam current data from the ion implanter system 70. The beam current measurement interface 706 may include or be coupled to an array of Faraday cups positioned in or near a beam path.

In operation, the processor unit 702 may send a scan instruction with a slow and/or constant scan velocity profile to the beam scan controller 704. The beam scan controller 704 may then cause the ion beam in the ion implanter system 70 to scan across the array of faraday cups along a beam path according to the scan velocity profile. At the same time, the data of the plurality of spot beam profiles measured by the array of faraday cups may be forwarded to the processor unit 702 via the beam current measurement interface 706. The processor unit 702 may mathematically create a model for predicting a scanned ion beam current density distribution along the beam path by using a series of spot beam profiles based on the data of the plurality of spot beam profiles. The processor unit 702 may then calculate an initial scan velocity profile by optimizing or otherwise adjusting the model of the scanned beam profile to predicted a scanned beam profile with a minimized standard deviation. Next, the processor unit 702 may send a scan instruction with an initial scan velocity profile to the beam scan controller 704. The beam scan controller 704 may then cause the ion beam in the ion implanter system 70 to scan along the beam path according to the initial scan velocity profile. At the same time, the scanned ion beam current density distribution data measured by moving the traveling Faraday cup across the scanned ion beam may be forwarded to the processor unit 702 via the beam current measurement interface 706. The processor unit 702 may calculate a standard deviation of the scanned ion beam current density distribution along the beam path. If the scanned beam profile is not uniform enough, the processor unit 702 may use the model of scanned beam profile to calculate a desired scan velocity profile for adjusting the scanned beam profile. The desired scan velocity profile may be communicated to the beam scan controller 704 which may cause a re-scan of the ion beam according to the desired scan velocity profile. Another measurement of the scanned ion beam current density distribution may be performed and the data sent to the processor unit 702. The process may be repeated until the processor unit 702 determines that uniformity in the scanned ion beam profile has been achieved.

According to embodiments of the present disclosure, before tuning a scan velocity profile for a uniform ion beam profile, it may be desirable to tune the ion source and/or the beam-line elements to minimize changes in the size or shape of the ion beam spot during scanning. First, an acceptable range of ion beam current may be identified and established. For example, a user may choose a target ion beam current and designate a ±5% range as an acceptable range. Second, the ion source and one or more other beam-line elements may be tuned to minimize changes in the shape or size of the ion beam spot while maintaining the ion beam current within the acceptable range. That is, instead tuning the ion source and the beam-line elements for a maximum ion beam current, it may only be necessary to keep the ion beam current within the acceptable range. Changes in the ion beam spot may be minimized by improving focus of the ion beam and/or centering the beam-line in every aperture or component. The cross-section of the ion beam may be changed so that it is less likely to be clipped by the various beam-line elements.

Figure 1:
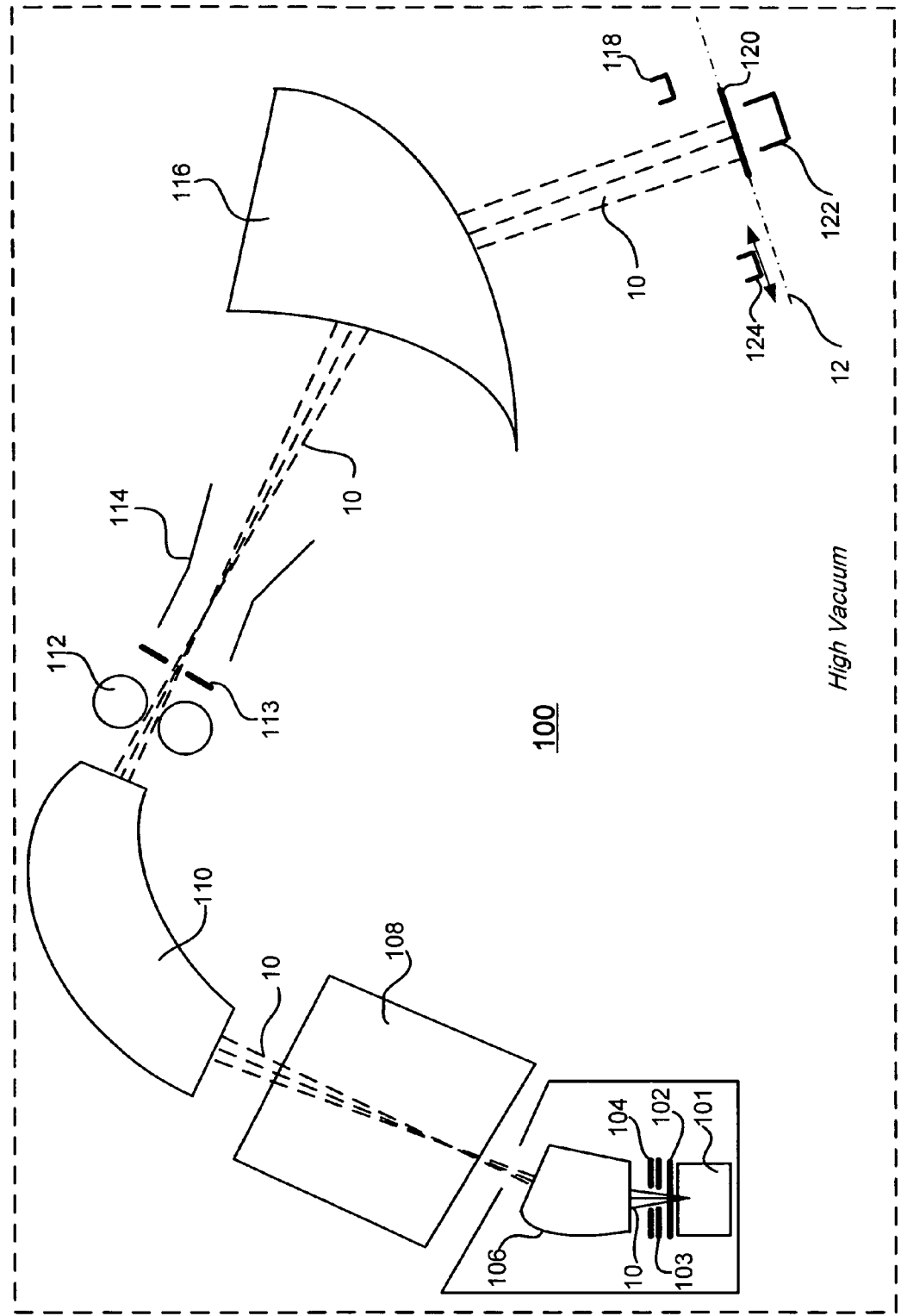
FIG. 1 is a diagram illustrating a known ion implanter system.
Figure 2:
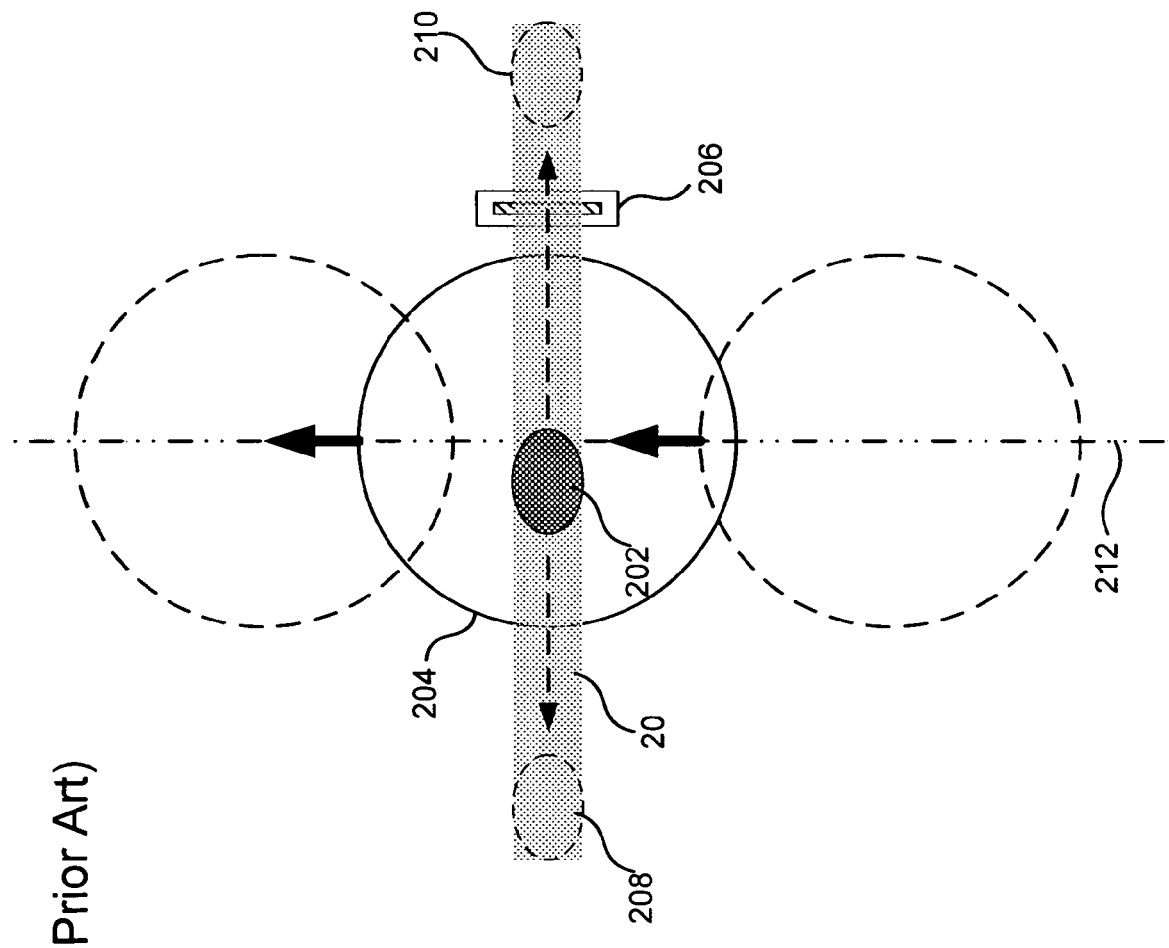
FIG. 2 illustrates a typical setup for scanning a series of wafers with an ion beam.
Figure 3:
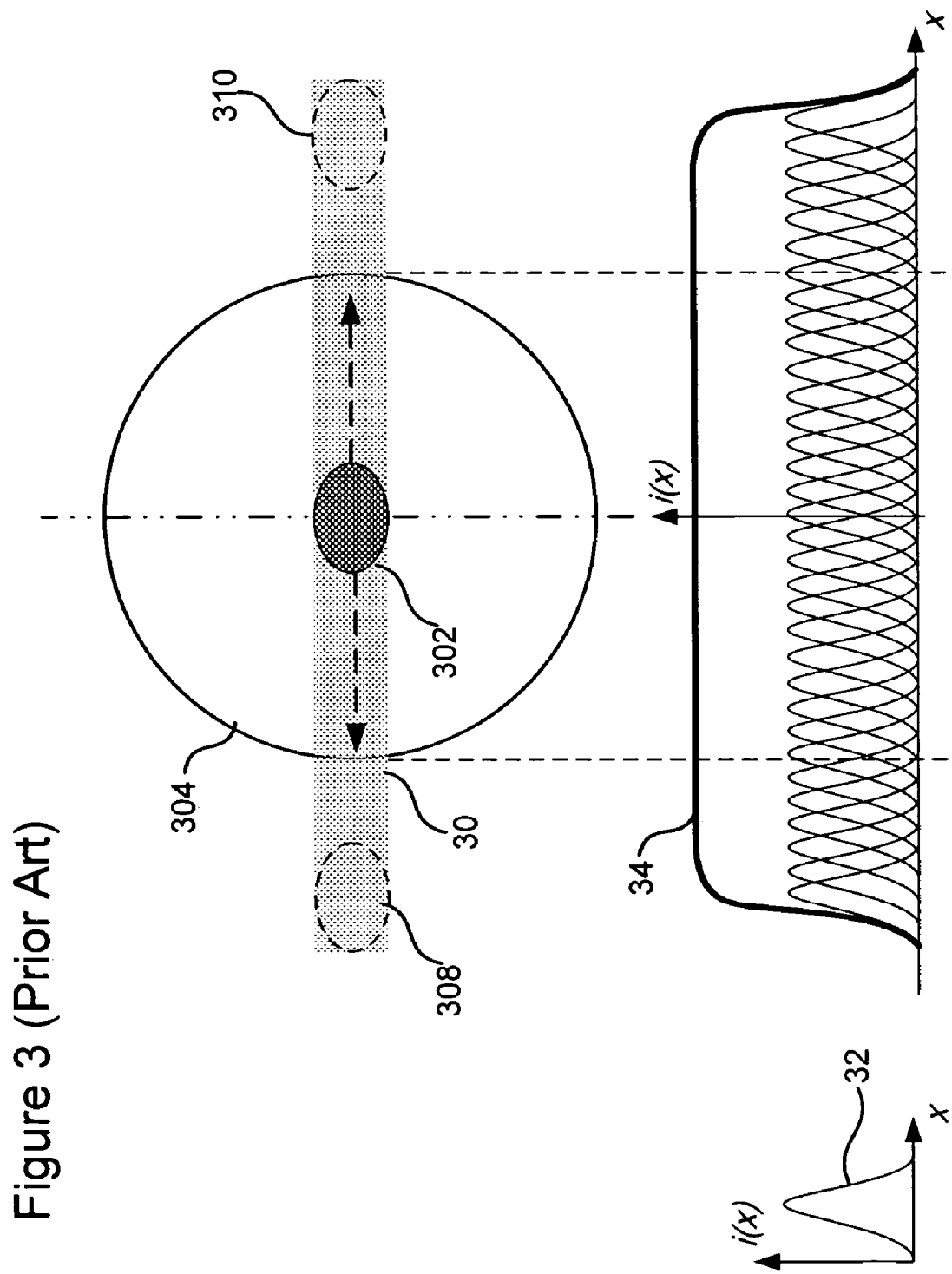
FIG. 3 illustrates a prior art method for uniformity tuning.

Referring again to FIG. 1, there is shown an ion implanter system 100 that is similar to a Model VIISta 810 implanter available from Varian Semiconductor Equipment Associates. In the system 100, a number of components may be tuned to minimize the ion beam 10 or any change thereof. For example, a new combination of settings for the filter magnet 106, the analyzer magnet 110 and the corrector magnet 116 may be selected to control the shape of the ion beam 10, which combination is typically different from one that is applied for a maximum ion beam current. In addition, various voltages on the various beam-focusing elements (e.g., the suppression electrode 103, the focus electrodes and tube lenses inside the acceleration or deceleration column 108, the low-energy lens 113, the scanner 114, or the corrector magnet 116) may be adjusted for a better focus and position control of the ion beam 10 so that its shape does not change substantially during scanning.

Since uniformity tuning may change the ion beam current level that has already been set up during beam-line tuning, the uniformity tuning and the beam-line tuning may be preferably coordinated. For example, during uniformity tuning, the effect of a uniformity correction on the ion beam current may be estimated and used as a decisioning criterion. If a uniformity correction will cause the ion beam current to drop below an acceptable level, such uniformity correction may not be applied. Alternatively, whenever the ion beam current moves out of the acceptable range during uniformity tuning, the beam-line tuning may be repeated.

At this point it should be noted that the technique for uniformity tuning in an ion implanter system in accordance with the present disclosure as described above typically involves the processing of input data and the generation of output data to some extent. This input data processing and output data generation may be implemented in hardware or software. For example, specific electronic components may be employed in an ion implanter system or similar or related circuitry for implementing the functions associated with ion beam uniformity tuning in accordance with the present disclosure as described above. Alternatively, one or more processors operating in accordance with stored instructions may implement the functions associated with ion beam uniformity tuning in accordance with the present disclosure as described above. If such is the case, it is within the scope of the present disclosure that such instructions may be stored on one or more processor readable carriers (e.g., a magnetic disk), or transmitted to one or more processors via one or more signals.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure can be beneficially implemented in any number of environments for any number of purposes. Accordingly, the claims set forth below should be construed in view of the full breadth and spirit of the present disclosure as described herein.

The invention claimed is:

1. A method for ion beam uniformity tuning, the method comprising:

generating an ion beam in an ion implanter system;

tuning one or more beam-line elements in the ion implanter system to reduce changes in a beam spot of the ion beam when the ion beam is scanned along a beam path; and adjusting a velocity profile for scanning the ion beam along the beam path such that the ion beam produces a substantially uniform ion beam profile along the beam path.

2. The method according to claim 1, wherein the step of tuning the one or more beam-line elements further comprises maintaining a current produced by the ion beam within a predetermined range that is less than a maximum ion beam current level.

3. The method according to claim 2, further comprising:

stopping the adjustment of the velocity profile if the current produced by the ion beam falls below the predetermined range; and re-tuning the one or more beam-line elements to recover the current.

4. The method according to claim 1, wherein the one or more beam-line elements are selected from a group consisting of:

an ion source;

an extraction electrode;

a suppression electrode;

a filter magnet;

a focus lens;

a tube lens;

an analyzer magnet;

a low-energy lens;

a scanner; and a corrector magnet.

5. The method according to claim 1, further comprising:

measuring the ion beam at a plurality of predetermined locations along the beam path;

calculating an ion beam profile along the beam path based at least in part on the ion beam measurements at the plurality of predetermined locations; and adjusting the velocity profile based at least in part on the calculated ion beam profile.

6. At least one signal embodied in at least one carrier wave for transmitting a computer program of instructions configured to be readable by at least one processor for instructing the at least one processor to execute a computer process for performing the method as recited in claim 1.

7. At least one processor readable carrier for storing a computer program of instructions configured to be readable by at least one processor for instructing the at least one processor to execute a computer process for performing the method as recited in claim 1.

8. A system for ion beam uniformity tuning, the system comprising:
   means for generating an ion beam in an ion implanter system;
   means for tuning one or more beam-line elements in the ion implanter system to reduce changes in a beam spot of the ion beam when the ion beam is scanned along a beam path; and
   means for adjusting a velocity profile for scanning the ion beam along the beam path such that the ion beam produces a substantially uniform ion beam profile along the beam path.

9. The system according to claim 8, wherein the means for tuning the one or more beam-line elements further comprises means for maintaining a current produced by the ion beam within a predetermined range that is less than a maximum ion beam current level.

10. The system according to claim 9, further comprising:
    means for stopping the adjustment of the velocity profile if the current produced by the ion beam falls below the predetermined range; and
    means for re-tuning the one or more beam-line elements to recover the current.

11. The system according to claim 8, wherein the one or more beam-line elements are selected from a group consisting of:
    an ion source;
    an extraction electrode;
    a suppression electrode;
    a filter magnet;
    a focus lens;
    a tube lens;
    an analyzer magnet;
    a low-energy lens;
    a scanner; and
    a corrector magnet.

12. The system according to claim 8, further comprising:
    means for measuring the ion beam at a plurality of predetermined locations along the beam path;
    means for calculating an ion beam profile along the beam path based at least in part on the ion beam measurements at the plurality of predetermined locations; and
    means for adjusting the velocity profile based at least in part on the calculated ion beam profile.

13. A method for uniformity tuning in an ion implanter system, the method comprising:
    measuring an ion beam at a plurality of predetermined locations along a beam path;
    establishing a mathematical model that estimates, based on the ion beam measurements at the plurality of predetermined locations, an ion beam profile caused by scanning the ion beam along the beam path according to a velocity profile; and
    adjusting the velocity profile in a plurality of iteration steps to cause the ion beam profile to be substantially uniform along the beam path, wherein, in each iteration step, a correction to the velocity profile is calculated, with the mathematical model, based on corrections to the velocity profile and resulting changes in the ion beam profile during the previous two or more iteration steps.

* * * * *